(12) United States Patent
Kim et al.

(10) Patent No.: US 9,178,110 B2
(45) Date of Patent: Nov. 3, 2015

(54) LIGHT-EMITTING DEVICE AND METHOD FOR MANUFACTURING SAME

(71) Applicant: KOREA UNIVERSITY RESEARCH AND BUSINESS FOUNDATION, Seoul (KR)

(72) Inventors: Tae geun Kim, Seongnam-si (KR); Su-jin Kim, Seoul (KR)

(73) Assignee: KOREA UNIVERSITY RESEARCH AND BUSINESS FOUNDATION, Seoul (KR)

( * ) Notice: Subject to any disclaimer, the term of this patent is extended or adjusted under 35 U.S.C. 154(b) by 0 days.

(21) Appl. No.: 14/384,520

(22) PCT Filed: Jan. 10, 2013

(86) PCT No.: PCT/KR2013/000207
§ 371 (c)(1),
(2) Date: Sep. 11, 2014

(87) PCT Pub. No.: WO2013/137554
PCT Pub. Date: Sep. 19, 2013

(65) Prior Publication Data
US 2015/0028375 A1    Jan. 29, 2015

(30) Foreign Application Priority Data

Mar. 12, 2012 (KR) .......................... 10-2012-0024912

(51) Int. Cl.
*H01L 33/14* (2010.01)
*H01L 33/38* (2010.01)
*H01L 33/42* (2010.01)
(Continued)

(52) U.S. Cl.
CPC .............. *H01L 33/145* (2013.01); *H01L 33/38* (2013.01); *H01L 33/42* (2013.01); *H01L 33/60* (2013.01);
(Continued)

(58) Field of Classification Search
CPC ........ H01L 33/145; H01L 33/42; H01L 33/60
USPC .......................................................... 257/98
See application file for complete search history.

(56) References Cited

U.S. PATENT DOCUMENTS

| 2004/0051110 | A1* | 3/2004 | Oohata | ........................... 257/89 |
| 2010/0032701 | A1* | 2/2010 | Fudeta | ........................... 257/98 |

(Continued)

FOREIGN PATENT DOCUMENTS

| JP | 2010-40761 | 2/2010 |
| JP | 2011-228696 | 11/2011 |

(Continued)

OTHER PUBLICATIONS

International Search Report for International Application No. PCT/KR2013/000207, dated Apr. 24, 2013.

*Primary Examiner* — Yasser A Abdelaziez
*Assistant Examiner* — Hajar Kolahdouzan
(74) *Attorney, Agent, or Firm* — Kile Park Reed & Houtteman PLLC

(57) ABSTRACT

The present invention relates to a light-emitting device that is capable of preventing an increase in forward voltage while improving optical output characteristics, and to a method for manufacturing same. The light-emitting device comprises: a first conductive semiconductor layer; an active layer which is in contact with the first conductive semiconductor layer; a second conductive semiconductor layer which is in contact with the active layer and which has a patterned groove on a surface opposite the surface that is in contact with the active layer; a current-blocking layer which is formed on a bottom of the groove; a transparent conductive layer which is formed along a surface opposite the surface of the second conductive semiconductor layer that is in contact with the active layer, a sidewall of the groove, and the current-blocking layer; a reflective layer which is formed on a surface opposite the surface of the transparent conductive layer that is in contact with the second conductive semiconductor layer; a support substrate which is formed on a surface opposite the surface of the reflective layer that is in contact with the transparent conductive layer; and an electrode that is patterned on a surface opposite the surface of the first conductive semiconductor layer that is in contact with the active layer.

16 Claims, 8 Drawing Sheets

(51) Int. Cl.
  *H01L 33/60* (2010.01)
  *H01L 33/00* (2010.01)
  *H01L 33/20* (2010.01)
  *H01L 33/40* (2010.01)
  *H01L 33/44* (2010.01)

(52) U.S. Cl.
  CPC ............ *H01L 33/0079* (2013.01); *H01L 33/20* (2013.01); *H01L 33/382* (2013.01); *H01L 33/405* (2013.01); *H01L 33/44* (2013.01); *H01L 2933/0016* (2013.01); *H01L 2933/0058* (2013.01)

(56) References Cited

U.S. PATENT DOCUMENTS

2011/0024776 A1\* 2/2011 Kim et al. ................. 257/94
2011/0241045 A1\* 10/2011 Ye et al. ..................... 257/98

FOREIGN PATENT DOCUMENTS

KR  10-2009-0116840   11/2009
KR  10-1007140        1/2011

\* cited by examiner

LIGHT-EMITTING DEVICE AND METHOD FOR MANUFACTURING SAME

TECHNICAL FIELD

The present invention relates to a light-emitting device and a method for manufacturing the same, and more particularly, to a light-emitting device capable of enhancing optical output characteristics and capable of preventing increase of a forward voltage, and a method for manufacturing the same.

BACKGROUND ART

A light-emitting device is a device to emit light to outside by converting electric energy into light energy. As an example of such light-emitting device, there is a light-emitting diode (LED).

Recently, gallium nitride (GnN)-based LEDs are implemented as LEDs of red, green and blue (RGB) which can implement high brightness and white light owing to a metal organic chemical vapor deposition (MOCVD) of GaN, a growth method such as a molecular-beam epitaxial growth (MBE), and novel processing technology.

Such GnN-based LEDs are applied to a display, a backlight unit, an indoor/outdoor lighting device, etc. As the GnN-based LEDs are applied to an optical source for illumination, concern over LEDs of high output is increased.

The conventional LEDs of a horizontal structure have a low thermal conductivity because they are formed on an insulating substrate such as a sapphire substrate. Further, in the conventional LEDs of a horizontal structure, a process of removing part of an active layer is required for an ohmic contact between the active layer and an electrode, since an electrode is formed in a horizontal direction. This may cause a light-emitting area to be reduced, and a forward voltage may be increased due to current crowding.

In order to solve such problems, LEDs of a vertical structure is being spotlighted.

In the LEDs of a vertical structure, two electrodes and electrode pads are positioned at upper and lower sides of the LEDs as a sapphire substrate is removed by a laser lift-off (LLF) process. Under such structure, a current flows in one direction to enhance light-emitting efficiency and brightness.

However, in a case where the current is concentrated to a central part below an 'n'-type electrode formed on an 'n'-type semiconductor layer in the LEDs of a vertical structure, photons generated by recombination between electrons and holes in the active layer are concentrated to the central part below the 'n'-type electrode. Then a large amount of the generated photons are absorbed to the 'n'-type electrode. In this case, an effective light emission region, a region rather than the 'n'-type electrode may be reduced, thereby lowering light-emitting efficiency and brightness of the LEDs of a vertical structure.

In order to solve such problems, has been developed a structure to form a current-blocking layer (an insulating region) by depositing an insulating material or injecting ions on/into part of a 'p'-type semiconductor layer in the LEDs of a vertical structure.

Such current-blocking layer induces a current flow concentrated to a region below the 'n'-type electrode in a vertical direction, to a horizontal direction (effective light emission region). Accordingly, light-emitting intensity in the effective light emission region is increased, and thus light-emitting efficiency and brightness are enhanced. However, the current-blocking layer reduces an ohmic contact area in the 'p'-type semiconductor layer due to its insulating characteristic, resulting in increase of a forward voltage.

DISCLOSURE OF THE INVENTION

Therefore, an object of the present invention is to provide a light-emitting device capable of enhancing optical output characteristics and capable of preventing increase of a forward voltage, and a method for manufacturing the same.

To achieve these and other advantages and in accordance with the purpose of the present invention, as embodied and broadly described herein, there is provided a light-emitting device including: a first conductive semiconductor layer; an active layer which is in contact with the first conductive semiconductor layer; a second conductive semiconductor layer which is in contact with the active layer, and which has a patterned groove on one surface thereof opposite to another surface thereof that is in contact with the active layer; a current-blocking layer which is formed on a bottom of the groove; a transparent conductive layer which is formed along one surface of the second conductive semiconductor layer opposite to another surface thereof that is in contact with the active layer, a sidewall of the groove, and the current-blocking layer; a reflective layer which is formed on one surface of the transparent conductive layer opposite to another surface thereof that is in contact with the second conductive semiconductor layer; a support substrate which is formed on one surface of the reflective layer opposite to another surface thereof that is in contact with the transparent conductive layer; and an electrode that is patterned on one surface of the first conductive semiconductor layer opposite to another surface thereof that is in contact with the active layer.

The transparent conductive layer may have a structure where horizontal portions and vertical portions are alternately formed.

The reflective layer may include a flat portion contacting the horizontal portions, and protrusion portions protruding from the flat portion to fill space formed by the horizontal portions and the vertical portions.

The transparent conductive layer may include a first region which contacts one surface of the second conductive semiconductor layer opposite to another surface thereof that is in contact with the active layer; a second region contacting a sidewall of the groove and connected to the first region; and a third region contacting the current-blocking layer, parallel to the first region, and connected to the second region.

The transparent conductive layer may include a first region which contacts one surface of the second conductive semiconductor layer opposite to another surface thereof that is in contact with the active layer; a second region contacting a sidewall of the groove and connected to the first region; a third region contacting the current-blocking layer, parallel to the first region, and connected to the second region; and a fourth region extending from the second region toward the second conductive semiconductor layer, in a direction perpendicular to the first region, and contacting two side surfaces of the current-blocking layer.

The current-blocking layer may have a quadrangular sectional shape.

The light-emitting device may further include an adhesive layer interposed between the reflective layer and the support substrate.

The current-blocking layer and the electrode may be formed to have the same pattern.

The current-blocking layer may be formed of an insulating material, or may be formed by plasma-processing a bottom of the groove using a plasma processing material.

The transparent conductive layer may be implemented as a transparent conducting oxide formed of a transparent conductive thin film layer having a metal such as In, Sn and Zn as a host material.

The first conductive type may be an 'n'-type, and the second conductive type may be a 'p'-type.

To achieve these and other advantages and in accordance with the purpose of the present invention, as embodied and broadly described herein, there is also provided a method for manufacturing a light-emitting device, the method including: a substrate preparing step of preparing a substrate where a first conductive semiconductor layer, an active layer and a second conductive semiconductor layer have been sequentially formed; a current-blocking layer forming step of forming a patterned groove on an exposed surface of the second conductive semiconductor layer, and forming a current-blocking layer on a bottom of the groove; a transparent conductive layer forming step of forming a transparent conductive layer along one surface of the second conductive semiconductor layer opposite to another surface thereof that is in contact with the active layer, a sidewall of the groove, and the current-blocking layer; a reflective layer forming step of forming a reflective layer on one surface of the transparent conductive layer opposite to another surface thereof that is in contact with the second conductive semiconductor layer; a support substrate forming and substrate removing step of forming a support substrate on one surface of the reflective layer opposite to another surface thereof that is in contact with the transparent conductive layer, and then of removing a substrate; and an electrode forming step of forming a patterned electrode on one surface of the first conductive semiconductor layer opposite to another surface thereof that is in contact with the active layer.

In the current-blocking layer forming step, the current-blocking layer may be formed by disposing a photoresist pattern on one surface of the second conductive semiconductor layer opposite to another surface thereof that is in contact with the active layer, and by depositing an insulating material on a bottom of the groove, or by plasma-processing the bottom of the groove using a plasma processing material.

In the current-blocking layer forming step, the current-blocking layer may be formed by disposing a photoresist pattern on one surface of the second conductive semiconductor layer opposite to another surface thereof that is in contact with the active layer, and a sidewall of the groove, and by depositing an insulating material on a bottom of the groove, or by plasma-processing the bottom of the groove using a plasma processing material.

In the reflective layer forming step, the reflective layer may be formed by depositing a reflecting material so as to fill space formed in the transparent conductive layer.

In the electrode forming step, the electrode may be formed to have the same pattern as the groove.

Advantageous Effects

In the light-emitting device and the method for manufacturing the same according to the present invention, there are provided the current-blocking layer, and the transparent conductive layer having a structure where horizontal portions and vertical portions are alternately formed. Accordingly, in a case where the current-blocking layer has been formed, an ohmic contact area between the semiconductor layer and the transparent conductive layer can be increased, and a current flow path can be increased.

In the light-emitting device and the method for manufacturing the same according to the present invention, optical output characteristics can be enhanced by using the current-blocking layer. Further, increase of a forward voltage can be prevented by using the transparent conductive layer.

MODES FOR CARRYING OUT THE PREFERRED EMBODIMENTS

Hereinafter, the present invention will be explained in more detail with reference to the attached drawings.

Figure 1A:
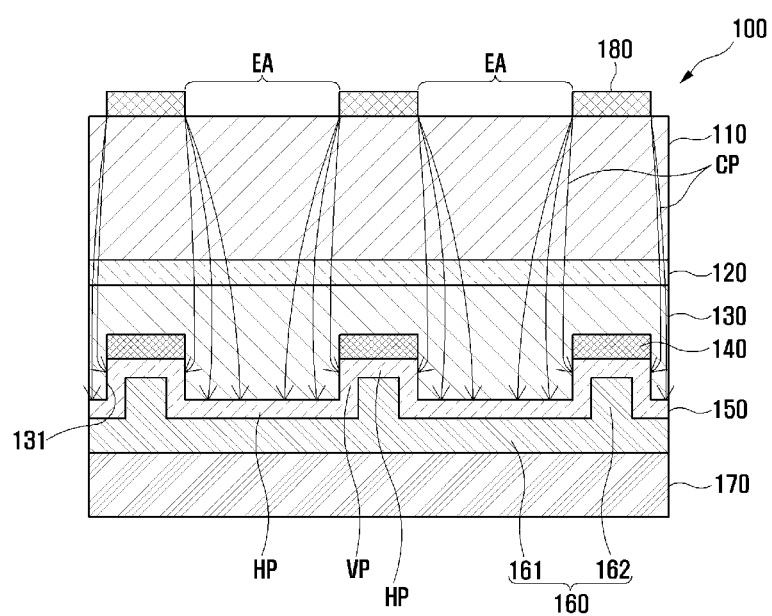
FIG. 1A is a sectional view of a light-emitting device according to an embodiment of the present invention.
Figure 1B:
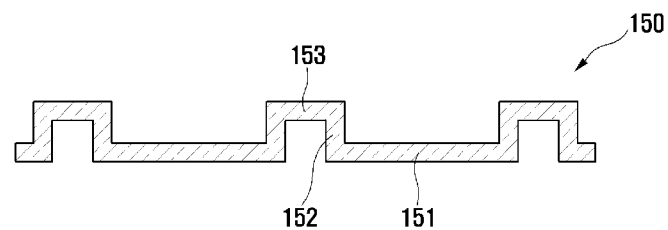
FIG. 1B is a sectional view illustrating a detailed configuration of a transparent conductive layer of FIG. 1A.

FIG. 1A is a sectional view of a light-emitting device according to an embodiment of the present invention, and FIG. 1B is a sectional view illustrating a detailed configuration of a transparent conductive layer of FIG. 1A.

Referring to FIGS. 1A and 1B, the light-emitting device 100 according to an embodiment of the present invention includes a first conductive semiconductor layer 110, an active layer 120, a second conductive semiconductor layer 130, a current-blocking layer 140, a transparent conductive layer 150, a reflective layer 160, a support substrate 170, and an electrode 180. Such light-emitting device 100 may implement light-emitting diodes of a vertical structure.

The first conductive semiconductor layer 110 may be implemented as an 'n'-type semiconductor layer. The 'n'-type semiconductor layer may be selected from semiconductor materials having a composition formula of $In_xAl_yGa_{1-x-y}N$ ($0 \leq x \leq 1$, $0 \leq y \leq 1$, $0 \leq x+y \leq 1$), e.g., InAlGaN, GaN, AlGaN, AlInN, InGaN, AlN, InN, etc. An 'n'-type dopant such as Si, Ge and Sn may be doped on the 'n'-type semiconductor layer.

The active layer 120 is in contact with the first conductive semiconductor layer 110. The active layer 120 may be formed of materials including a semiconductor material having a composition formula of $In_xAl_yGa_{1-x-y}N$ ($0 \leq x \leq 1$, $0 \leq y \leq 1$, $0 \leq x+y \leq 1$), for example. The active layer 120 may have one of a single quantum well structure, a multi quantum well (MQW) structure, a quantum point structure and a quantum line structure. The active layer 120 may generate light by energy generated when electrons and holes of the first conductive semiconductor layer 110 and the second conductive semiconductor layer 130 are recombined with each other.

The second conductive semiconductor layer 130 is in contact with the active layer 120, and may be implemented as a 'p'-type semiconductor layer. The 'p'-type semiconductor layer may be selected from semiconductor materials having a composition formula of $In_xAl_yGa_{1-x-y}N$ ($0 \leq x \leq 1$, $0 \leq y \leq 1$, $0 \leq x+$ y≤1), e.g., InAlGaN, GaN, AlGaN, AlInN, InGaN, AlN, InN, etc. A 'p'-type dopant such as Mg, Zn, Ca, Sr and Ba may be doped onto the 'p'-type semiconductor layer. A patterned groove 131 is formed on one surface of the second conductive semiconductor layer 130 opposite to another surface thereof that is in contact with the active layer 120. The groove 131 provides space where the current-blocking layer 140 and the transparent conductive layer 150 are partially buried in the second conductive semiconductor layer 130. A sidewall of the groove 131 is in contact with two side surfaces of the current-blocking layer 140.

The first conductive semiconductor layer 110, the active layer 120 and the second conductive semiconductor layer 130 form a light-emitting structure for generating and emitting light.

The current-blocking layer 140 is formed on a bottom (bottom surface) of the groove 131. The current-blocking layer 140 may have a quadrangular sectional shape. The current-blocking layer 140 may be formed of materials including at least one of insulating materials such as $Ga_2O_3$, $In_2O_3$, ZnO, $SiO_2$, $Al_2O_3$ and $Si_3N_4$. The current-blocking layer 140 may be formed by plasma-processing the bottom of the groove 131, using at least one of plasma processing materials such as $CH_4$, $CH_4/H_2$, $SF_6$, $SF_6/Ar$, Ar, $SF_6/O_2$, $CHF_3$, $CF_4$ and $CF_4O/O_2$. The current-blocking layer 140 serves to induce a current flow concentrated to a region below the electrode 180 in a vertical direction, to a horizontal direction, i.e., an effective light-emitting area (EA) direction.

The transparent conductive layer 150 is formed along one surface of the second conductive semiconductor layer 130 opposite to another surface thereof that is in contact with the active layer 120, a sidewall of the groove 131, and the current-blocking layer 140. The transparent conductive layer 150 has a structure where horizontal portions (HP) and vertical portions (VP) are alternately formed.

More specifically, as shown in FIG. 1B, the transparent conductive layer 150 includes a first region 151 which contacts one surface of the second conductive semiconductor layer 130 opposite to another surface thereof that is in contact with the active layer 120; a second region 152 contacting a sidewall of the groove 131 and connected to the first region 151; and a third region 153 contacting the current-blocking layer 140, parallel to the first region 151, and connected to the second region 152. The transparent conductive layer 150 forms not only a current flow path (CP) through the first region 151, but also a current flow path (CP) through the third region 153 in the effective light-emitting area (EA). The transparent conductive layer 150 may be implemented as a transparent conducting oxide (TCO) formed of a transparent conductive thin film layer having a metal such as In, Sn and Zn as a host material.

The reflective layer 160 is formed on one surface of the transparent conductive layer 150 opposite to another surface thereof that is in contact with the second conductive semiconductor layer 130. More specifically, the reflective layer 160 includes a flat portion 161 contacting the horizontal portions (HP) of the transparent conductive layer 150, and protrusion portions 162 protruding from the flat portion 161 to fill space formed by the horizontal portions (HP) and the vertical portions (VP) of the transparent conductive layer 150. The reflective layer 160 may include reflecting materials such as Ag, Ni, Al, Rh, Pd, Ir, Ru, Mg, Zn, Pt and Au, such that light generated from the active layer 120 is emitted to outside of the first conductive semiconductor layer 110.

The support substrate 170 is formed on one surface of the reflective layer 160 opposite to another surface thereof that is in contact with the transparent conductive layer 150. The support substrate 170 supports a light-emitting structure, and applies a voltage to the light-emitting structure together with the electrode 180. The support substrate 170 may be formed of at least one of a conducting material (e.g., Cu, Au, Ni, Mo and Cu—W) and a carrier wafer (e.g., Si, Ge GaAs, ZnO, Sic, etc.), such that a current flows to the second conductive semiconductor layer 130. Although not shown, an adhesive layer, which includes at least one of a barrier metallic material and a bonding metallic material, may be interposed between the reflective layer 160 and the support substrate 170. The adhesive layer may be formed in a case where the support substrate 170 is attached to the reflective layer 160 by a bonding method, whereas the adhesive layer may not be formed in a case where the support substrate 170 is attached to the reflective layer 160 by a plating or deposition method. The adhesive layer may include at least one of Ti, Au, Sn, Ni, Cr, Ga, In, Bi, Cu, Ag and Ta.

The electrode 180 is patterned on one surface of the first conductive semiconductor layer 110 opposite to another surface thereof that is in contact with the active layer 120. The electrode 180 may be formed to have the same pattern as the current-blocking layer 140. The electrode 180 may be configured as a single layer or multi layers formed of a material selected from the group consisting of conducting materials for supplying a current to the first conductive semiconductor layer 110, e.g., Ti, Cr, Al, Cu and Au.

The light-emitting device 100 according to an embodiment of the present invention is provided with the transparent conductive layer 150 having a structure where the horizontal portions (HP) and the vertical portions (VP) are alternately formed. Thus, an ohmic contact area between the second conductive semiconductor layer 130 and the transparent conductive layer 150 can be increased. Further, a current flow path (CP) can be formed through two or more regions, i.e., the first region 151 and the third region 153 in the effective light-emitting area (EA).

When compared with the conventional light-emitting device having a transparent conductive layer provided with only horizontal portions and thereby forming a current flow path through a single region in an effective light-emitting area, in the light-emitting device 100 according to an embodiment of the present invention, an ohmic contact area between the second conductive semiconductor layer 130 and the transparent conductive layer 150 can be more increased. Thus, in the present invention, a contact resistance can be more reduced, and a current flow path can be more increased.

Under such configuration, the light-emitting device 100 according to an embodiment of the present invention can enhance optical output characteristics by using the current-blocking layer 140, and can prevent increase of a forward voltage (Vf) by using the transparent conductive layer 150.

Hereinafter, a light-emitting device according to another embodiment of the present invention will be explained in more detail.

Figure 2A:
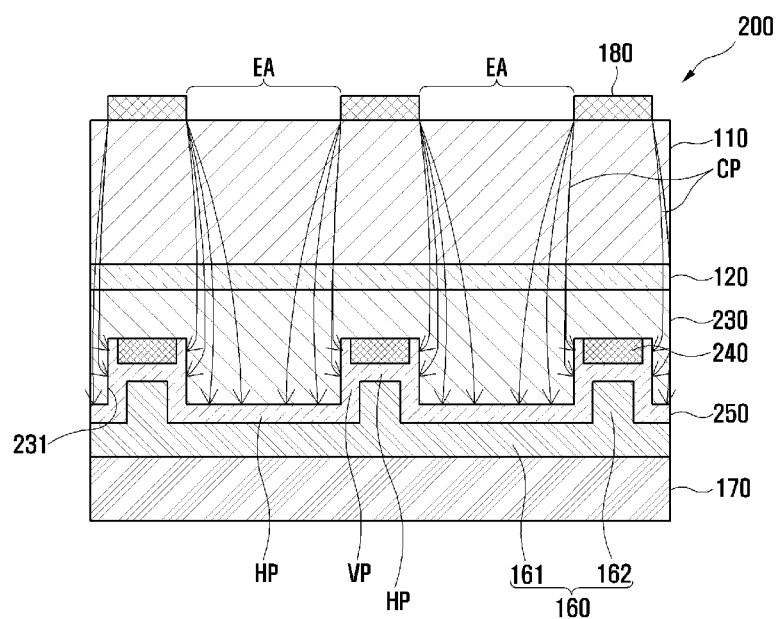
FIG. 2A is a sectional view of a light-emitting device according to another embodiment of the present invention.
Figure 2B:
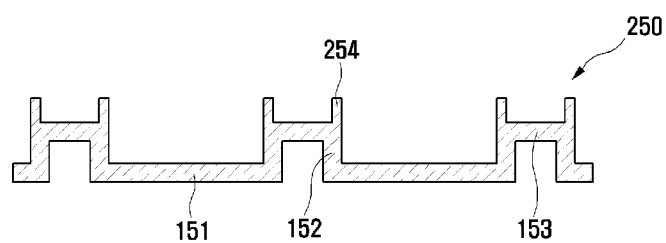
FIG. 2B is a sectional view illustrating a detailed configuration of a transparent conductive layer of FIG. 2A.

FIG. 2A is a sectional view of a light-emitting device according to another embodiment of the present invention, and FIG. 2B is a sectional view illustrating a detailed configuration of a transparent conductive layer of FIG. 2A.

The light-emitting device 200 according to another embodiment has the same configuration as the light-emitting device 100 according to an embodiment, except for a second conductive semiconductor layer 230, a current-blocking layer 240 and a transparent conductive layer 250. Thus, only the second conductive semiconductor layer 230, the current-blocking layer 240 and the transparent conductive layer 250 of the light-emitting device 200 according to another embodiment will be explained.

Referring to FIGS. 2A and 2B, the light-emitting device 200 according to another embodiment of the present invention includes a first conductive semiconductor layer 110, an active layer 120, a second conductive semiconductor layer 230, a current-blocking layer 240, a transparent conductive layer 250, a reflective layer 160, a support substrate 170 and an electrode 180.

The second conductive semiconductor layer 230 is similar to the second conductive semiconductor layer 130 of FIG. 1A, except that a groove 231 of the second conductive semiconductor layer 230 has a different size from the groove 131 of the second conductive semiconductor layer 130. That is, the groove 231 has a size large enough for its sidewall to be spaced from two side surfaces of the current-blocking layer 240.

The current-blocking layer 240 is similar to the current-blocking layer 140 of FIG. 1A. However, the current-blocking layer 240 is formed so that two side surfaces thereof are spaced from the sidewall of the groove 231 of the second conductive semiconductor layer 230.

The transparent conductive layer 250 is similar to the transparent conductive layer 150 of FIG. 1A except for the following configuration. More specifically, as shown in FIG. 2B, the transparent conductive layer 250 includes a first region 151 which contacts one surface of the second conductive semiconductor layer 230 opposite to another surface thereof that is in contact with the active layer 120; a second region 152 contacting a sidewall of the groove 231 and connected to the first region 151; a third region 153 contacting the current-blocking layer 240, parallel to the first region 151, and connected to the second region 152; and a fourth region 254 extending from the second region 152 toward the second conductive semiconductor layer 230, in a direction perpendicular to the first region 151, and contacting two side surfaces of the current-blocking layer 240. The transparent conductive layer 250 forms not only a current flow path (CP) through the first region 151 and a current flow path (CP) through the third region 153, but also a current flow path (CP) through the fourth region 254, in an effective light-emitting area (EA). Thus, a current flow path can be more increased.

The light-emitting device 200 according to another embodiment of the present invention is provided with the transparent conductive layer 250 having a structure where horizontal portions (HP) and vertical portions (VP) are alternately formed. Thus, an ohmic contact area between the second conductive semiconductor layer 130 and the transparent conductive layer 250 can be increased. Further, a current flow path (CP) can be formed through two or more regions, i.e., the first region 151, the third region 153 and the fourth region 254 in the effective light-emitting area (EA).

When compared with the conventional light-emitting device having a transparent conductive layer provided with only horizontal portions and thereby forming a current flow path through a single region in an effective light-emitting area, in the light-emitting device 200 according to another embodiment of the present invention, an ohmic contact area between the second conductive semiconductor layer 230 and the transparent conductive layer 250 can be more increased. Thus, in the present invention, a contact resistance can be more reduced, and a current flow path can be more increased.

Under such configuration, the light-emitting device 200 according to another embodiment of the present invention can enhance optical output characteristics by using the current-blocking layer 240, and can prevent increase of a forward voltage (Vf) by using the transparent conductive layer 250.

Hereinafter, a method for manufacturing the light-emitting device 100 according to an embodiment of the present invention will be explained.

Figure 3:
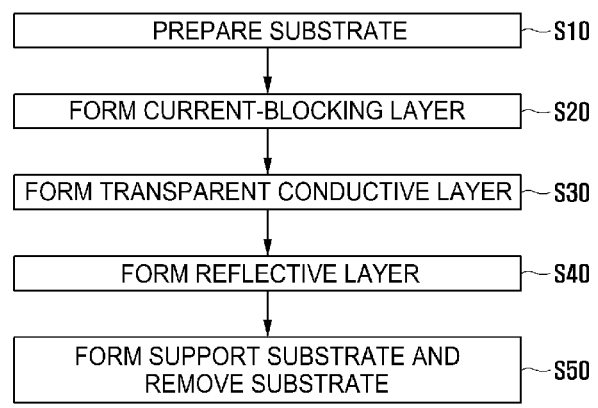
FIG. 3 is a flowchart for explaining a method for manufacturing the light-emitting device of FIG. 1.

FIG. 3 is a flowchart for explaining a method for manufacturing the light-emitting device of FIG. 1, and FIGS. 4A to 4G are sectional views for explaining the method for manufacturing the light-emitting device of FIG. 3.

Referring to FIG. 3, the method for manufacturing the light-emitting device 100 according to an embodiment of the present invention includes a substrate preparing step (S10), a current-blocking layer forming step (S20), a transparent conductive layer forming step (S30), a reflective layer forming step (S40), a support substrate forming and substrate removing step (S50), and an electrode forming step (S60).

Figure 4A:
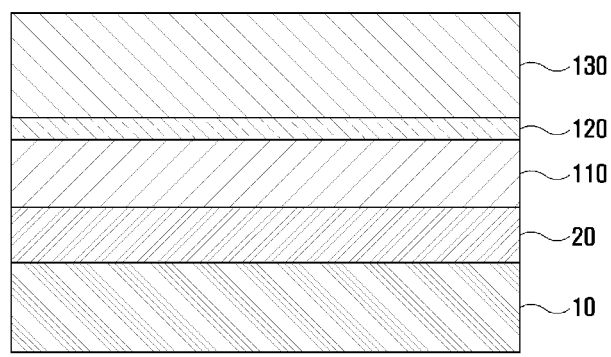
FIGS. 4A to 4G are sectional views for explaining the method for manufacturing the light-emitting device of FIG. 3.

Referring to FIG. 4A, the substrate preparing step (S10) is a step of preparing a substrate 10 where a first conductive semiconductor layer 110, an active layer 120 and a second conductive semiconductor layer 130 have been sequentially formed.

In the substrate preparing step (S10), the first conductive semiconductor layer 110, the active layer 120 and the second conductive semiconductor layer 130 are sequentially deposited on the substrate by a physical vapor deposition (PVD), a chemical vapor deposition (CVD), a plasma laser deposition (PLD), a method using a dual-type thermal evaporator, a sputtering method and a metal organic chemical vapor deposition (MOCVD). The first conductive semiconductor layer 110, the active layer 120 and the second conductive semiconductor layer 130 have been aforementioned, and thus detailed explanations thereof will be omitted.

The substrate 10 may be formed of a material selected from the group consisting of a sapphire substrate ($Al_2O_3$), GaN, SiC, ZnO, Si, GaP, InP, $Ga_2O_3$, a conductive substrate and GaAs. An undoped semiconductor layer 20, e.g., an undoped GaN layer may be formed between the substrate 10 and the first conductive semiconductor layer 110. The undoped semiconductor layer 20 enhances a thin film characteristic by reducing a difference of lattice constants between itself and the substrate 10.

Figure 4B:
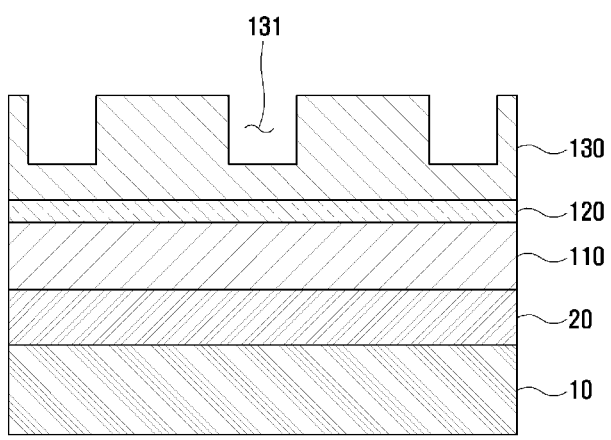
Figure 4C:
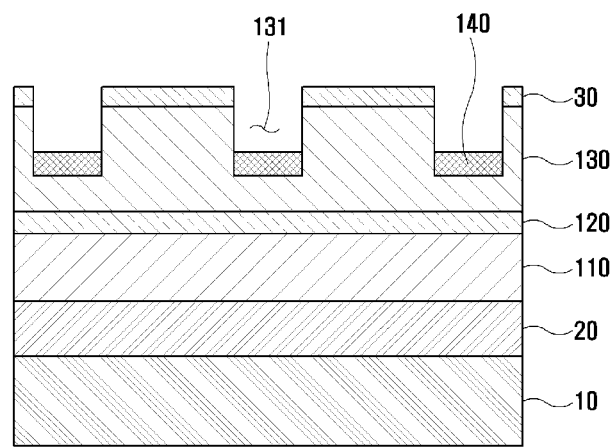

Referring to FIGS. 4B and 4C, the current-blocking layer forming step (S20) is a step of forming a patterned groove 131 on an exposed surface of the second conductive semiconductor layer 130, and forming a current-blocking layer 140 on a bottom of the groove 131.

In the current-blocking layer forming step (S20), the groove 131 may be formed by selectively etching an exposed surface of the second conductive semiconductor layer 130, using an etching method, e.g., an inductive coupled plasma (ICP) etching method. The current-blocking layer 140 may be formed by depositing an insulating material on a bottom of the groove 131, using a photoresist pattern 30 as a mask. The photoresist pattern 30 is disposed on one surface of the second conductive semiconductor layer 130 opposite to another surface thereof that is in contact with the active layer 120. The insulating material may be at least one of $Ga_2O_3$, $In_2O_3$, ZnO, $SiO_2$, $Al_2O_3$ and $Si_3N_4$. The current-blocking layer 140 may be formed by plasma-processing a bottom of the groove 131, using at least one of plasma processing materials such as $CH_4$, $CH_4/H_2$, $SF_6$, $SF_6/Ar$, Ar, $SF_6/O_2$, $CHF_3$, $CF_4$ and $CF_4O/O_2$.

Figure 4D:
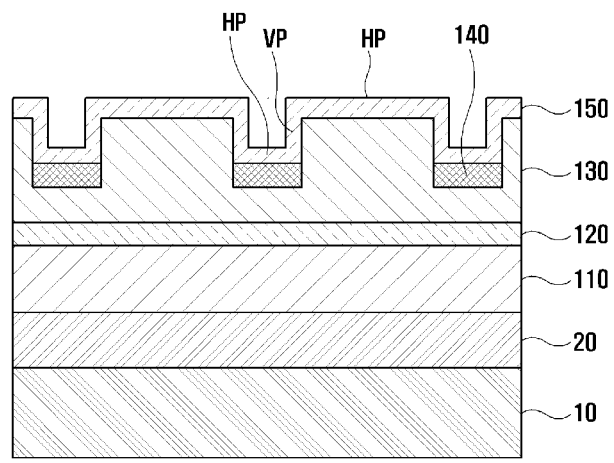

Referring to FIG. 4D, the transparent conductive layer forming step (S30) is a step of forming a transparent conductive layer 150 along one surface of the second conductive semiconductor layer 130 opposite to another surface thereof that is in contact with the active layer 120, a sidewall of the groove 131, and the current-blocking layer 140.

More specifically, the transparent conductive layer 150 may be implemented as a transparent conducting oxide (TCO) formed by a deposition method by using a metal such as In, Sn or Zn as a host material, after the photoresist pattern 30 has been removed. The transparent conductive layer 150 may have a structure where horizontal portions (HP) and vertical portions (VP) are alternately formed.

Figure 4E:
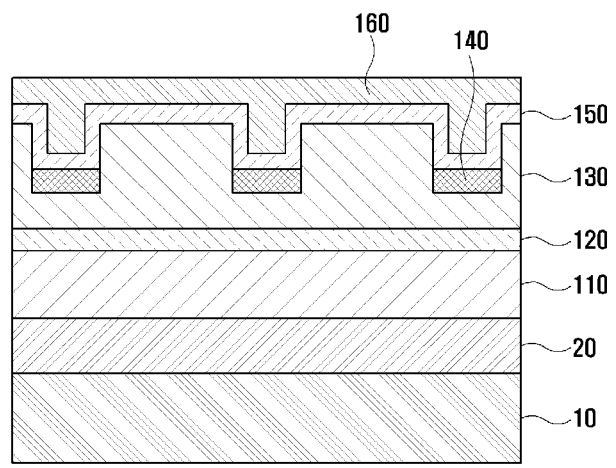

Referring to FIG. 4E, the reflective layer forming step (S40) is a step of forming a reflective layer 160 on one surface of the transparent conductive layer 150 opposite to another surface thereof that is in contact with the second conductive semiconductor layer 130.

More specifically, the reflective layer 160 is formed by depositing a reflecting material so as to fill space formed in the transparent conductive layer 150 by a deposition method.

Figure 4F:
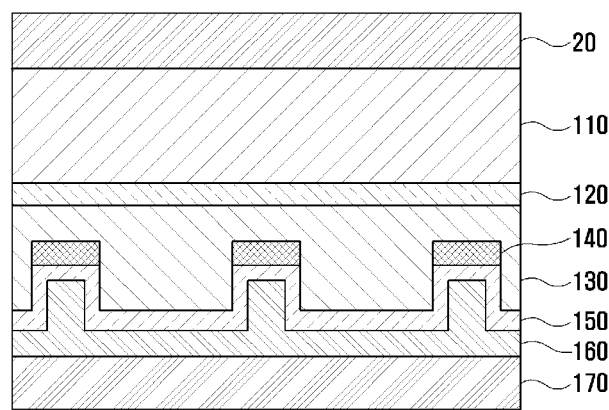

Referring to FIG. 4F, the support substrate forming and substrate removing step (S50) is a step of forming a support substrate 170 on one surface of the reflective layer 160 opposite to another surface thereof that is in contact with the transparent conductive layer 150, and then of removing a substrate 10.

More specifically, the support substrate 170 may be formed on the reflective layer 160 by a plating or deposition method. Alternatively, the support substrate 170 may be formed on the reflective layer 160 by a bonding method, through an adhesive layer (not shown) interposed between the transparent conductive layer 150 and the support substrate 170.

The substrate 10 may be removed by a laser lift-off (LLO) method. Upon removal of the substrate 10, the undoped semiconductor layer 20 is exposed to be removed by an etching method.

Figure 4G:
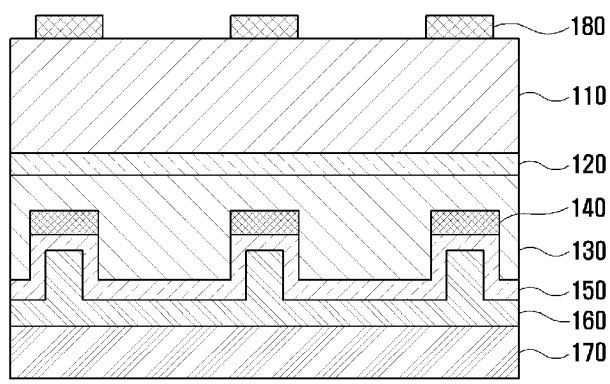

Referring to FIG. 4G, the electrode forming step (S60) is a step of forming a patterned electrode 180 on one surface of the first conductive semiconductor layer 110 opposite to another surface thereof that is in contact with the active layer 120.

More specifically, the electrode 180 is formed by patterning a conducting material so as to have the same pattern as the current-blocking layer 140, by a photography process, etc.

Hereinafter, a method for manufacturing the light-emitting device 200 according to another embodiment of the present invention will be explained.

The method for manufacturing the light-emitting device 200 according to another embodiment is the same as the method for manufacturing the light-emitting device 100 according to another embodiment, except for a current-blocking layer forming step and a transparent conductive layer forming step. Thus, only the current-blocking layer forming step and the transparent conductive layer forming step in the method for manufacturing the light-emitting device 200 according to another embodiment will be explained.

Figure 5:
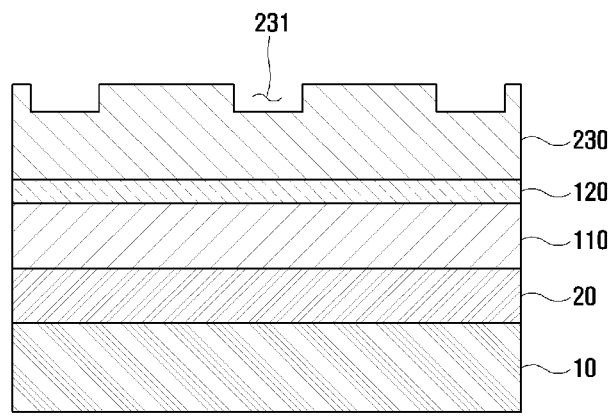
FIGS. 5 and 6 are sectional views for explaining a step of forming a current-blocking layer in a method for manufacturing a light-emitting device according to another embodiment of the present invention.
Figure 6:
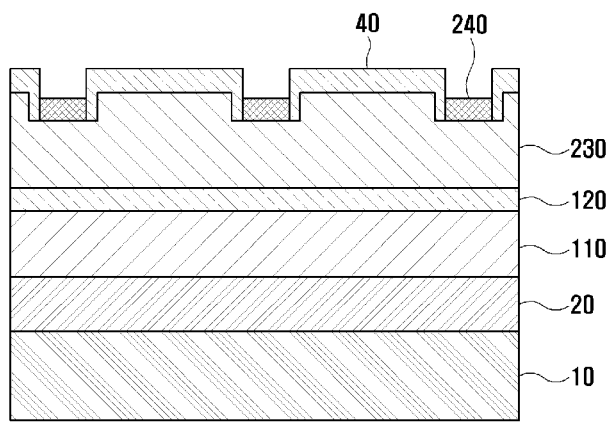
Figure 7:
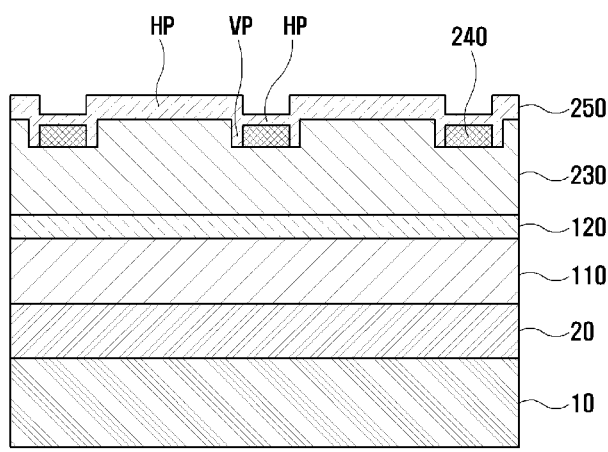
FIG. 7 is a sectional view for explaining a step of forming a transparent conductive layer in a method for manufacturing a light-emitting device according to another embodiment of the present invention.

FIGS. 5 and 6 are sectional views for explaining a step of forming a current-blocking layer in a method for manufacturing a light-emitting device according to another embodiment of the present invention, and FIG. 7 is a sectional view for explaining a step of forming a transparent conductive layer in a method for manufacturing a light-emitting device according to another embodiment of the present invention.

Referring to FIGS. 5 and 6, the current-blocking layer forming step is a step of forming a patterned groove 231 on an exposed surface of a second conductive semiconductor layer 230, and forming a current-blocking layer 240 on a bottom of the groove 231.

In the current-blocking layer forming step, the groove 231 may be formed by selectively etching an exposed surface of the second conductive semiconductor layer 230, using an etching method, e.g., an inductive coupled plasma (ICP) etching method. The current-blocking layer 240 may be formed by depositing an insulating material on a bottom of the groove 231, using a photoresist pattern 40 as a mask. The photoresist pattern 40 is disposed on one surface of the second conductive semiconductor layer 230 opposite to another surface thereof that is in contact with the active layer 120, as well as at two sidewalls of the groove 231. The insulating material may be at least one of $Ga_2O_3$, $In_2O_3$, ZnO, $SiO_2$, $Al_2O_3$ and $Si_3N_4$. The current-blocking layer 240 may be formed by plasma-processing a bottom of the groove 231, using at least one of $CH_4$, $CH_4/H_2$, $SF_6$, $SF_6/Ar$, Ar, $SF_6/O_2$, $CHF_3$, $CF_4$ and $CF_4O/O_2$.

Referring to FIG. 7, the transparent conductive layer forming step is a step of forming a transparent conductive layer 250 along one surface of the second conductive semiconductor layer 230 opposite to another surface thereof that is in contact with the active layer 120, a sidewall of the groove 231, and the current-blocking layer 240.

More specifically, the transparent conductive layer 250 may be implemented as a transparent conducting oxide (TCO) formed by a deposition method by using a metal such as In, Sn or Zn as a host material, after the photoresist pattern 40 has been removed. The transparent conductive layer 250 may have a structure where horizontal portions (HP) and vertical portions (VP) are alternately formed.

It will be apparent to those skilled in the art that various modifications and variations can be made in the present invention without departing from the spirit or scope of the invention. Thus, it is intended that the present invention cover modifications and variations of this invention provided they come within the scope of the appended claims and their equivalents.

The invention claimed is:

1. A light-emitting device, comprising:
   a first conductive semiconductor layer;
   an active layer which is in contact with the first conductive semiconductor layer;
   a second conductive semiconductor layer which is in contact with the active layer, and which has a patterned groove on one surface thereof opposite to another surface thereof that is in contact with the active layer;
   a current-blocking layer which is formed only on a bottom surface of the groove excluding a sidewall of the groove;
   a transparent conductive layer which is formed along one surface of the second conductive semiconductor layer opposite to another surface thereof that is in contact with the active layer, a sidewall of the groove, and the current-blocking layer;
   a reflective layer which is formed on one surface of the transparent conductive layer opposite to another surface thereof that is in contact with the second conductive semiconductor layer;
   a support substrate which is formed on one surface of the reflective layer opposite to another surface thereof that is in contact with the transparent conductive layer; and
   an electrode that is patterned on one surface of the first conductive semiconductor layer opposite to another surface thereof that is in contact with the active layer.

2. The light-emitting device of claim 1, wherein the transparent conductive layer has a structure where horizontal portions and vertical portions are alternately formed.

3. The light-emitting device of claim 2, wherein the reflective layer includes:
   a flat portion contacting the horizontal portions; and
   protrusion portions protruding from the flat portion to fill space formed by the horizontal portions and the vertical portions.

4. The light-emitting device of claim 1, wherein the transparent conductive layer includes:
  a first region which contacts one surface of the second conductive semiconductor layer opposite to another surface thereof that is in contact with the active layer;
  a second region contacting a sidewall of the groove and connected to the first region; and
  a third region contacting the current-blocking layer, parallel to the first region, and connected to the second region.

5. The light-emitting device of claim 1, wherein the transparent conductive layer includes:
  a first region which contacts one surface of the second conductive semiconductor layer opposite to another surface thereof that is in contact with the active layer;
  a second region contacting a sidewall of the groove and connected to the first region;
  a third region contacting the current-blocking layer, parallel to the first region, and connected to the second region; and
  a fourth region extending from the second region toward the second conductive semiconductor layer, in a direction perpendicular to the first region, and contacting two side surfaces of the current-blocking layer.

6. The light-emitting device of claim 1, wherein the current-blocking layer has a quadrangular sectional shape.

7. The light-emitting device of claim 1, further comprising an adhesive layer interposed between the reflective layer and the support substrate.

8. The light-emitting device of claim 1, wherein the current-blocking layer and the electrode are formed to have the same pattern.

9. The light-emitting device of claim 1, wherein the current-blocking layer is formed of an insulating material, or is formed by plasma-processing a bottom of the groove using a plasma processing material.

10. The light-emitting device of claim 1, wherein the transparent conductive layer is implemented as a transparent conducting oxide formed of a transparent conductive thin film layer having a metal such as In, Sn and Zn as a host material.

11. The light-emitting device of claim 1, wherein the first conductive type is an 'n'-type and the second conductive type is a 'p'-type.

12. A method for manufacturing a light-emitting device, the method comprising:
  a substrate preparing step of preparing a substrate where a first conductive semiconductor layer, an active layer and a second conductive semiconductor layer have been sequentially formed;
  a current-blocking layer forming step of forming a patterned groove on an exposed surface of the second conductive semiconductor layer, and forming a current-blocking layer only on a bottom surface of the groove excluding a sidewall of the groove;
  a transparent conductive layer forming step of forming a transparent conductive layer along one surface of the second conductive semiconductor layer opposite to another surface thereof that is in contact with the active layer, a sidewall of the groove, and the current-blocking layer;
  a reflective layer forming step of forming a reflective layer on one surface of the transparent conductive layer opposite to another surface thereof that is in contact with the second conductive semiconductor layer;
  a support substrate forming and substrate removing step of forming a support substrate on one surface of the reflective layer opposite to another surface thereof that is in contact with the transparent conductive layer, and then of removing a substrate; and
  an electrode forming step of forming a patterned electrode on one surface of the first conductive semiconductor layer opposite to another surface thereof that is in contact with the active layer.

13. The method of claim 12, wherein in the current-blocking layer forming step, the current-blocking layer is formed by disposing a photoresist pattern on one surface of the second conductive semiconductor layer opposite to another surface thereof that is in contact with the active layer, and by depositing an insulating material on a bottom of the groove, or by plasma-processing the bottom of the groove using a plasma processing material.

14. The method of claim 12, wherein in the current-blocking layer forming step, the current-blocking layer is formed by disposing a photoresist pattern on one surface of the second conductive semiconductor layer opposite to another surface thereof that is in contact with the active layer, and a sidewall of the groove, and by depositing an insulating material on a bottom of the groove, or by plasma-processing the bottom of the groove using a plasma processing material.

15. The method of claim 12, wherein in the reflective layer forming step, the reflective layer is formed by depositing a reflecting material so as to fill space formed in the transparent conductive layer.

16. The method of claim 12, wherein in the electrode forming step, the electrode is formed to have the same pattern as the groove.

* * * * *